United States Patent [19]

Main

[11] Patent Number: 4,709,171
[45] Date of Patent: Nov. 24, 1987

[54] CURRENT LIMITER AND METHOD FOR LIMITING CURRENT

[75] Inventor: William E. Main, Mesa, Ariz.

[73] Assignee: Motorola, Inc., Schaumburg, Ill.

[21] Appl. No.: 382,754

[22] Filed: May 27, 1982

[51] Int. Cl.[4] .............................................. H03K 17/08
[52] U.S. Cl. .................................... 307/567; 307/300; 307/540
[58] Field of Search ................. 307/296 R, 300, 540, 307/544, 549, , 567; 330/288, 298

[56] References Cited

U.S. PATENT DOCUMENTS 3,845,405 10/1974 Leidich ................................ 307/567
4,157,513  6/1979 Ghiringelli et al. ................ 330/298

Primary Examiner—John Zazworsky
Attorney, Agent, or Firm—Vincent B. Ingrassia

[57] ABSTRACT

A circuit and method for limiting the current through a transistor that is driven from a preceding amplifier stage. The circuit comprises an additional transistor having the base and emitter thereof connected to the base and emitter of the transistor whose current is to be limited. A current source is supplied to the collector of the additional transistor which transistor becomes saturated when a limiting threshold is reached as the magnitude of the drive current supplied to the bases of the two transistors exceeds a value wherein the current source can not supply the collector current required by the additional transistor.

4 Claims, 3 Drawing Figures

CURRENT LIMITER AND METHOD FOR LIMITING CURRENT

BACKGROUND OF THE INVENTION

The present invention relates to a method for regulating current and, more particularly, to a circuit and method for limiting the current flow in a semiconductor device.

There are many applications in which it is desirable to protect a transistor by limiting the maximum current flow in the collector-emitter path of the transistor. For instance, when a transistor is operating in its active region, a large voltage drop across the collector-emitter electrodes in the device could cause the transistor to be damaged or even destroyed because the power dissipation characteristics of the transistor may be exceeded. One way to prevent this occurrence is to limit the current through the transistor to a maximum value which is well within the power handling capabilities of the device.

One prior art technique for protecting high gain transistors from conducting high currents simultaneously with large voltage potentials applied across the collector-emitter junctions thereof is to utilize a sense resistor between the emitter and ground reference in conjunction with a feedback circuit coupled between the emitter and base of the transistor. In a typical application, the feedback circuit may be an additional transistor having its base and emitter coupled across the sense resistor and its collector connected to the base of the transistor to be protected. Hence, whenever the current through the high gain transistor produces a voltage across the sense resistor sufficient to turn on the feedback transistor, base current to the high gain transistor is stolen through the collector-emitter of the feedback transistor thereby limiting the current in the output transistor.

However, the above described prior art circuit suffers from two disadvantages that may not be acceptable in some applications requiring protection of output transistors commonly found in operational amplifiers, comparators, automotive circuits, etc. First, the voltage drop across the sense resistor is at least equal to the base-to-emitter voltage, $V_{BE}$, of the feedback transistor which reduces the $V_{SAT}$ characteristics of the circuit comprising the protected transistor. Thus, the maximum output voltage swing of this prior art circuit is limited which may not be tolerable. Secondly, the addition of the sense resistor causes a loss in the $g_m$ of the transistor amplifier which is not desirable in many cases.

Another prior art method for limiting current in an output transistor is illustrated in FIG. 1 herein. This prior art circuit comprises output transistors 10 and diode 12 and is commonly referred to as a current mirror. The anode and cathode of diode 12 is connected to the base and emitter respectively of transistor 10. Transistor 10 is illustrated as having an emitter area N times the area of the anode region of diode 12 as understood. A preceding or intermediate amplifier stage comprising transistor 14, which is adapted to receive an input signal at base 16, is coupled at its collector to the base and anode of transistor 10 and diode 12 respectively. A current source 18, supplying a current I, is connected between power supply $V_{CC}$ and the collector of transistor 14.

In operation, the output current flowing in transistor 10 is at all times equal to NI', where I' is the current flow in diode 12. Thus, the maximum current flow at the collector of transistor 10 is limited to NI. Hence, it is seen that this circuit suffers from a severe loss of beta, the forward current gain factor of the transistor.

Therefore, a need exists for a circuit and method for limiting the current in a semiconductor device which circuit exhibits good VSAT characteristics and which does not suffer severe loss in the gain thereof.

SUMMARY OF THE INVENTION

Accordingly, it is an object of the present invention to provide an improved circuit and method for limiting the current through a semiconductor device to a maximum predetermined value.

It is another object of the present invention to provide a circuit and method for limiting the current flow in a transistor.

In accordance with the above and other objects there is provided a method of limiting the current flow through a first transistor comprising the steps of providing a second transistor of like conductivity type as the first transistor having its base and emitter coupled respectively to the base and emitter of the first transistor, the emitter area of the first transistor being N times the emitter area of the second transistor; and coupling a source of current to the collector of said second transistor, the base of the first and second transistors receiving base current drive thereto.

DETAILED DESCRIPTION OF THE PREFERRED EMBODIMENT

Figure 1:
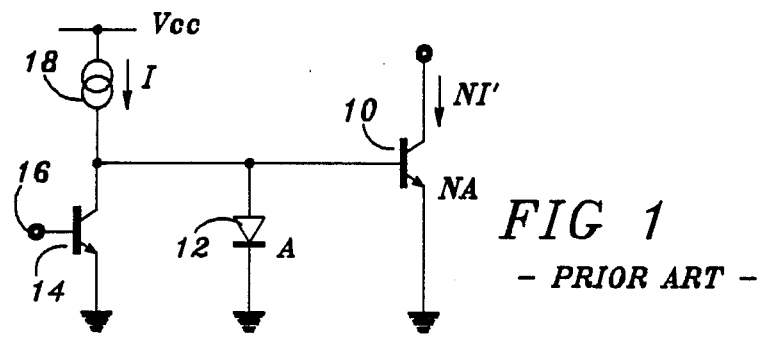
FIG. 1 is a schematic illustrating a prior art current limiter circuit.
Figure 2:
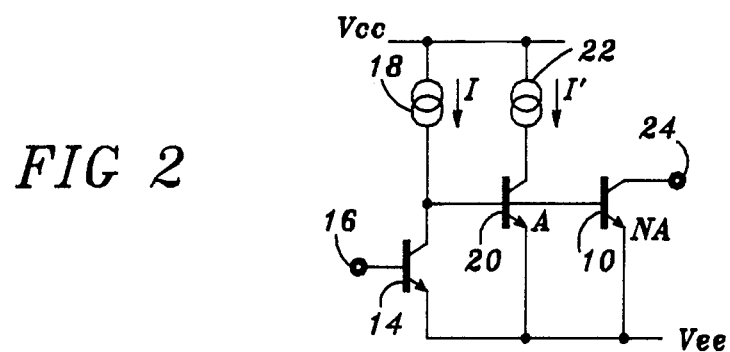
FIG. 2 is a schematic illustrating the current limiter circuit of the preferred embodiment.

Turning now to FIG. 2 there is illustrated the novel method and structure for limiting the collector current of transistor 10 to a predetermined value. It is to be understood that the components of FIG. 2 corresponding to like components illustrated in FIG. 1 have the same reference numerals. As described previously, transistor 10 may be an output amplifier stage which is driven by a predriver transistor amplifier or intermediate amplifier stage 14. Current limiting is accomplished by addition of transistor 20. The base and emitter electrodes of transistor 20 are coupled to the base and emitter respectively of transistor 10: the transistor whose collector current is to be limited. The collector of transistor 20 is coupled to current source 22 which sources a constant current of value I' thereto. As indicated, the emitter area of transistor 10 is made N times the emitter area of transistor 20. The output of the circuit is taken at node 24, the collector of transistor 10.

Under normal operating conditions the input drive signal to base input 16 of transistor 14 is such that transistors 10 and 20 are either operated in their active or cut off regions. If operated in their active region, the overall gain of the output stage comprising the two transistors 10 and 20 is proportional to the forward current gain, beta, of the matched transistors times the base current drive supplied thereto from current source 18. There is some slight loss of gain in the circuit of FIG. 2 when compared to the gain thereof without transistor 20 because of the base current flowing in this transistor. However, the gain of the circuit remains substantially the same being reduced by a factor of 1/N+1.

When the input signal to transistor 14 is such as to cause a decrease in conduction of this transistor to a threshold limiting value, the value wherein excess base current drive is available from current source 18 to transistor 20, the circuit is operated in a current limiting mode. Hence, at the limiting threshold value the magnitude of the portion of the current, I, supplied to the base of transistor 20 causes this transistor to want to source a larger current at its collector than can be supplied by current source 22. Thus, there is insufficient collector current available to transistor 20 to satisfy its requirement, the transistor is therefore caused to become saturated. In this state, the current in the collector of transistor 10 is limited to a value of NI' as no additional base drive current can be supplied thereto. The excess base current drive available to transistors 10 and 20 when transistor 20 is saturated is sunk to the substrate of the IC circuit through a parasitic PN device formed by the base-collector junction of transistor 20 being forward biased. Thus, protection is provided to transistor 10 by limiting the current therethrough although the gain of this transistor stage has been only slightly decreased. In addition, the $V_{SAT}$ characteristics of the circuit have not been affected by addition of current limiting transistor 20.

Hence, the circuit and method described above for current limiting allows the transistor whose collector current is to be limited to operate unhindered up to the limiting threshold value. Thereafter, the current through the transistor is limited to a predetermined maximum value.

Figure 3:
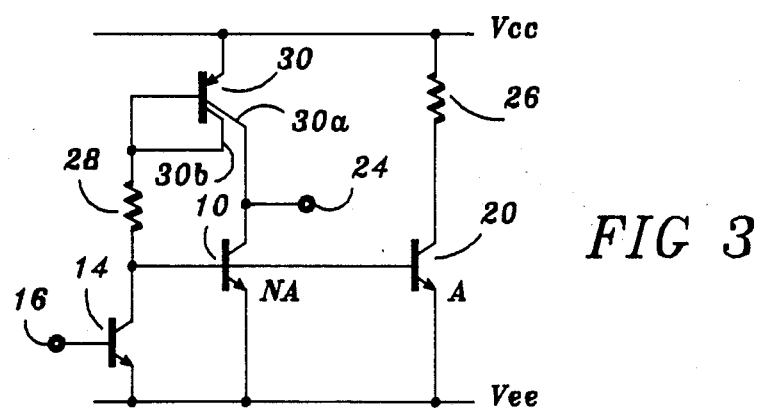
FIG. 3 is a more detailed schematic illustrating the circuit of FIG. 2.

FIG. 3 illustrates a particular circuit configuration for the circuit described and shown in FIG. 2 which has been fabricated in monolithic integrated circuit form. The collector of transistor 14 is coupled through series resistor 28 to the base of a multi-collector PNP transistor 30. Current source 22 is realized by resistor 26. The collector of output transistor 10 is coupled to VCC through multi-collector PNP transistor 30 via collector 30a. Collector 30b of transistor 30 is coupled with its base to resistor 28.

In operation the collector current of transistor 10 is limited to N times the current flowing through resistor 26. If for examle N is equal to the integer 4 (the emitter region of t&ansistor 10 being four times the emitter region of transistor 20) the approximate value of current in transistor 10 at limiting is equal to:

$$I_{MAX} = 4(V_{CC}/R_{26})$$

Thus, by varying the value of resistor 26 the maximum value of current on transistor 10 can be programmed.

I claim:

1. In a monolithic circuit including a first transistor to which base current drive is supplied, a method for limiting the current through the collector-emitter thereof, comprising the steps of:
    providing a current source; and
    providing a second transistor of like conductivity type as the first transistor having its base and emitter coupled respectively to the base and emitter of the first transistor and its collector coupled to said current source, the emitter of the first transistor being N times the area of said emitter of said second transistor, said second transistor becoming saturated as the base current exceeds a value at which said second transistor requires a greater collector current than can be supplied by said current source wherein the collector current flowing in the first transistor is limited to a value of N times the magnitude of current sourced from said current source.

2. In a integrated circuit including an intermediate transistor amplifier stage which supplies current drive to an output transistor stage having an output transistor, a method for limiting the collector current of the output transistor, comprising the steps of:
    providing an additional transistor having its base and emitter coupled respectively to the base and emitter of the output transistor, the emitter of the output transistor having an area N times the area of said emitter of said additional transistor; and
    supplying a source of current to the collector of said additional transistor; said additional transistor becoming saturated as the current drive supplied to the base thereof exceeds a value at which said additional transistor requires a greater collector current than can be supplied by said source of current wherein the current flow through the output transistor is limited.

3. In an integrated circuit including a transistor having a base, an emitter and collector the base being coupled to a preceding amplifier stage, a circuit for limiting the collector current of the transistor, comprising:
    an additonal transistor having a base, an emitter, and a collector, said base being coupled with the base of the transistor to the preceding amplifier stage receiving base drive therefrom, said emitter being coupled to the emitter of the transistor, the emitter of the transistor having an area N times said area of said emitter of said additional transistor;
    a current source for supplying a current of predetermined magnitude to said collector of said additional transistor, said additional transistor becoming saturated to limit the collector current of the transistor when the base drive exceeds a limiting threshold value at which said current source can not supply the full collector current required by said additional transistor.

4. The circuit of claim 3 wherein said first current source is a resistor that is coupled between a source of operating potential and said collector of said additional transistor.

* * * * *